(12) United States Patent
Mei et al.

(10) Patent No.: US 11,611,025 B2
(45) Date of Patent: Mar. 21, 2023

(54) DISPLAY PANEL, MANUFACTURING METHOD THEREOF, AND DISPLAY DEVICE

(71) Applicant: Shenzhen China Star Optoelectronics Semiconductor Display Technology Co., Ltd., Guangdong (CN)

(72) Inventors: Xueru Mei, Guangdong (CN); Macai Lu, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 316 days.

(21) Appl. No.: 17/054,521

(22) PCT Filed: Aug. 4, 2020

(86) PCT No.: PCT/CN2020/106806
§ 371 (c)(1),
(2) Date: Nov. 11, 2020

(87) PCT Pub. No.: WO2022/007074
PCT Pub. Date: Jan. 13, 2022

(65) Prior Publication Data
US 2022/0190218 A1  Jun. 16, 2022

(30) Foreign Application Priority Data

Jul. 10, 2020 (CN) .......................... 202010663708.0

(51) Int. Cl.
H01L 33/62 (2010.01)
H01L 25/075 (2006.01)
H01L 33/40 (2010.01)

(52) U.S. Cl.
CPC .......... *H01L 33/62* (2013.01); *H01L 25/0753* (2013.01); *H01L 33/40* (2013.01);
(Continued)

(58) Field of Classification Search
CPC ..... H01L 33/62; H01L 25/0753; H01L 33/40; H01L 2933/0016; H01L 2933/0066; H01L 25/167; H01L 27/156
See application file for complete search history.

(56) References Cited

U.S. PATENT DOCUMENTS 10,388,627 B1  8/2019  Chen
2013/0119392 A1* 5/2013 Park .................. H01L 27/326
                                                      438/34

(Continued)

FOREIGN PATENT DOCUMENTS

CN  103107181  5/2013
CN  208284480  12/2018
(Continued)

*Primary Examiner* — Victor A Mandala

(57) ABSTRACT

The present application provides a display panel, a manufacturing method thereof, and a display device. The present application adopts a molybdenum/copper stackup to form a solder pad for bonding, which can effectively solve a problem of a poor bonding force between MTD and a soldering material in the prior art. Meanwhile, a bonding lead is made of titanium-molybdenum-nickel alloy/copper/titanium-molybdenum-nickel alloy stackup, which can reduce manufacturing processes of the display panel and reduce manufacturing costs.

20 Claims, 4 Drawing Sheets

(52) U.S. Cl.
CPC .............. *H01L 2933/0016* (2013.01); *H01L 2933/0066* (2013.01)

(56) References Cited

U.S. PATENT DOCUMENTS

| | | | |
|---|---|---|---|
| 2016/0013436 A1* | 1/2016 | Im .................... | H01L 51/5203 257/40 |
| 2016/0020422 A1* | 1/2016 | Kim .................. | H01L 51/5253 257/40 |
| 2017/0345882 A1* | 11/2017 | Nam ................. | H01L 27/3258 |
| 2018/0151828 A1* | 5/2018 | Im .................... | H01L 51/5228 |
| 2019/0013277 A1* | 1/2019 | Lin .................... | H01L 23/53204 |
| 2019/0075633 A1* | 3/2019 | Tsai .................. | G02F 1/13454 |
| 2020/0043400 A1* | 2/2020 | Chen ................. | G09G 3/22 |
| 2020/0152826 A1* | 5/2020 | Lee ................... | H01L 33/24 |
| 2020/0212022 A1 | 7/2020 | Ahmed | |
| 2021/0020721 A1* | 1/2021 | Kwack .............. | H01L 27/3246 |
| 2021/0043817 A1* | 2/2021 | Liang ................ | H01L 33/62 |
| 2021/0091052 A1* | 3/2021 | Schuele ............. | H01L 24/81 |
| 2022/0037297 A1* | 2/2022 | Lu .................... | H01L 27/1259 |
| 2022/0157230 A1* | 5/2022 | Suzuki ............... | G09G 3/32 |
| 2022/0173087 A1* | 6/2022 | Xing ................. | H01L 25/167 |
| 2022/0199650 A1* | 6/2022 | Wang ................ | H01L 27/127 |
| 2022/0302096 A1* | 9/2022 | Ikeda ................ | H01L 33/60 |

FOREIGN PATENT DOCUMENTS

| | | |
|---|---|---|
| CN | 110416248 | 11/2019 |
| CN | 110752194 | 2/2020 |
| CN | 111312742 | 6/2020 |

\* cited by examiner

DISPLAY PANEL, MANUFACTURING METHOD THEREOF, AND DISPLAY DEVICE

RELATED APPLICATIONS

This application is a National Phase of PCT Patent Application No. PCT/CN2020/106806 having International filing date of Aug. 4, 2020, which claims the benefit of priority of Chinese Patent Application No. 202010663708.0 filed on Jul. 10, 2020. The contents of the above applications are all incorporated by reference as if fully set forth herein in their entirety.

FIELD AND BACKGROUND OF THE INVENTION

The present application is related to the field of display technology, and specifically, to a display panel, a manufacturing method thereof, and a display device.

Mini/micro light-emitting diode (MLED) display technology has entered an accelerated development stage in past two years and can be used in small-and-medium-sized and high-value-added display applications. Compared with organic light-emitting diode (OLED) displays, MLED displays can show better performance in terms of cost, contrast, high brightness, and thin-and-light appearance.

In the MLED display technology, backplate technology is a key technology, and optimizing backplate technology is essential for the MLED display technology. A conventional BCE-TFT backplate technology uses 6-mask technology, wherein M2 uses Mo/Cu metal as an LED bonding pad and uses ITO as a COF bonding protective layer to prevent Cu electrodes from oxidation. However, a process temperature window of the BCE-TFT backplate technology is relatively low, and an increase of the PV film forming temperature easily causes the Cu electrodes to oxidize and affect electrical conductivity. In addition, heat treatment temperature required for metal oxide semiconductors varies with a material composition, and some oxides require a high-temperature manufacturing process, and this technology cannot be better compatible. Currently, MoTiNi (MTD) alloy is usually used as M2. The MTD alloy has high stability and strong oxidation resistance, and improves a process window. However, a solder paste bonding force required for bonding this alloy and an LED is poor, which affects a bonding effect.

SUMMARY OF THE INVENTION

The present application provides a display panel, a manufacturing method thereof, and a display device, which can effectively solve problems of a poor bonding force between MoTiNi (MTD) and a soldering material, reduce manufacturing processes of the display panel, and reduce manufacturing costs.

In order to solve the above problems, technical solutions provided by the present application are as follows.

A display panel, including: a display region including a plurality of pixel regions; and a non-display region surrounding the display region;

a substrate; and a solder pad and a signal line disposed on the substrate, wherein the solder pad corresponds to each of the plurality of pixel regions and is electrically connected to the signal line;

Material of the solder pad includes at least one of a molybdenum/copper stackup, a molybdenum-titanium alloy/copper stackup, or a titanium-molybdenum-nickel alloy/copper stackup.

A solder electrode of a mini/micro light-emitting diode is electrically connected to the solder pad through a soldering material.

In the display panel of the present application, the display panel further includes a first electrode layer and a second electrode layer, which are disposed on the substrate. The first electrode layer includes a first electrode, a gate, and the solder pad, which are arranged at intervals. The second electrode layer includes a second electrode, a source, and a drain, which are arranged at intervals. The first electrode and the second electrode are positioned in the non-display region.

In the display panel of the present application, the display panel further includes a bonding lead corresponding to the non-display region. The signal line extends from the display region to the non-display region and is electrically connected to the bonding lead. The bonding lead includes the first electrode and the second electrode.

A circuit board is bonded to the display panel through the bonding lead and transmits signals with the signal line through the bonding lead.

In the display panel of the present application, material of the second electrode is a titanium-molybdenum-nickel alloy/copper/titanium-molybdenum-nickel alloy stackup.

In the display panel of the present application, the display panel further includes: an insulating layer disposed between the first electrode layer and the second electrode layer; and a passivation layer disposed on the second electrode layer. The insulating layer and the passivation layer are provided with a first opening partially exposing the solder pad. The passivation is provided with a second opening partially exposing the second electrode. The first opening contains the soldering material.

In the display panel of the present application, the display panel further includes an active layer disposed between the insulating layer and the second electrode layer. The active layer includes a channel region, a source contact region, and a drain contact region. The source contact region and the drain contact region are separated by the channel region.

In the display panel of the present application, material of the active layer includes at least one of indium-gallium-zinc oxide, indium-tin oxide, indium-zinc oxide, or aluminum-zinc oxide.

The present application further provides a manufacturing method of the display panel. The display panel includes a display region including a plurality of pixel regions and a non-display region surrounding the display region. The manufacturing method includes steps of:

step S10: forming a first metal layer on a substrate and patterning the first metal layer to form a first electrode layer, wherein the first electrode layer includes a first electrode corresponding to the non-display region, a gate corresponding to the display region, and a solder pad corresponding to each of the plurality of pixel regions;

step S20: forming a gate insulating layer and an active layer on the first electrode layer, wherein the active layer includes a channel region, a source contact region, and a drain contact region, and the source contact region and the drain contact region are separated by the channel region;

step S30: patterning the gate insulating layer to form a through hole positioned on the first electrode;

step S40: forming a second metal layer on the active layer and the gate insulating layer and patterning the second metal layer to form a second electrode layer, wherein the second electrode layer includes a second electrode positioned on the first electrode, a source in contact with the source contact region, and a drain in contact with the drain contact region, and the second electrode is in contact with the first electrode through the through hole;

step S50: forming a passivation layer on the second electrode layer and patterning the passivation layer to form an opening partially exposing the solder pad and an opening partially exposing the second electrode; and step S60: adding a soldering material into the opening corresponding to the solder pad and electrically connecting a solder electrode of a mini/micro light-emitting diode to the solder pad through the soldering material.

In the manufacturing method of the present application, the display panel further includes a bonding lead corresponding to the non-display region. A signal line extends from the display region to the non-display region and is electrically connected to the bonding lead. The bonding lead includes the first electrode and the second electrode.

A circuit board is bonded to the display panel through the bonding lead and transmits signals with the signal line through the bonding lead.

In the manufacturing method of the present application, material of the first metal layer includes at least one of a molybdenum/copper stackup, a molybdenum-titanium alloy/copper stackup, or a titanium-molybdenum-nickel alloy/copper stackup.

In the manufacturing method of the present application, material of the second metal layer is a titanium-molybdenum-nickel alloy/copper/titanium-molybdenum-nickel alloy stackup.

In the manufacturing method of the present application, material of the active layer includes at least one of indium-gallium-zinc oxide, indium-tin oxide, indium-zinc oxide, or aluminum-zinc oxide.

In the manufacturing method of the present application, in the step S60, the soldering material is added into the opening by a dispenser. The solder electrode of the mini/micro light-emitting diode is electrically connected to the solder pad through the soldering material by a transfer process.

The present application further provides a display device, including a display panel. The display panel includes: a display region including a plurality of pixel regions; a non-display region surrounding the display region;

a substrate; and a solder pad and a signal line disposed on the substrate, wherein the solder pad corresponds to each of the plurality of pixel regions and is electrically connected to the signal line.

Material of the solder pad includes at least one of a molybdenum/copper stackup, a molybdenum-titanium alloy/copper stackup, or a titanium-molybdenum-nickel alloy/copper stackup.

A solder electrode of a mini/micro light-emitting diode is electrically connected to the solder pad through a soldering material.

In the display device of the present application, the display panel further includes a first electrode layer and a second electrode layer, which are disposed on the substrate. The first electrode layer includes a first electrode, a gate, and the solder pad, which are arranged at intervals. The second electrode layer includes a second electrode, a source, and a drain, which are arranged at intervals. The first electrode and the second electrode are positioned in the non-display region.

In the display device of the present application, the display panel further includes a bonding lead corresponding to the non-display region. The signal line extends from the display region to the non-display region and is electrically connected to the bonding lead. The bonding lead includes the first electrode and the second electrode.

A circuit board is bonded to the display panel through the bonding lead and transmits signals with the signal line through the bonding lead.

In the display device of the present application, material of the second electrode is a titanium-molybdenum-nickel alloy/copper/titanium-molybdenum-nickel alloy stackup.

In the display device of the present application, the display panel further includes: an insulating layer disposed between the first electrode layer and the second electrode layer; and a passivation layer disposed on the second electrode layer. The insulating layer and the passivation layer are provided with a first opening partially exposing the solder pad. The passivation is provided with a second opening partially exposing the second electrode. The first opening contains the soldering material.

In the display device of the present application, the display panel further includes an active layer disposed between the insulating layer and the second electrode layer. The active layer includes a channel region, a source contact region, and a drain contact region. The source contact region and the drain contact region are separated by the channel region.

In the display device of the present application, material of the active layer includes at least one of indium-gallium-zinc oxide, indium-tin oxide, indium-zinc oxide, or aluminum-zinc oxide.

The present application adopts at least one of the molybdenum/copper stackup, the molybdenum-titanium alloy/copper stackup, or the titanium-molybdenum-nickel alloy/copper stackup to form the solder pad for bonding, which can effectively solve the problem of the poor bonding force between MTD and the soldering material in the prior art. Meanwhile, the bonding lead is made of titanium-molybdenum-nickel alloy/copper/titanium-molybdenum-nickel alloy stackup, which can reduce manufacturing processes of the display panel and reduce manufacturing costs.

DESCRIPTION OF SPECIFIC EMBODIMENTS OF THE INVENTION

The present application provides a display panel, a manufacturing method thereof, and a display device. In order to make purposes, technical solutions, and effects of the present application clearer and more specific, the present application is further described in detail below with reference to the accompanying drawings and examples. It should be understood that the specific embodiments described herein are only used to explain the application, and are not used to limit the present application.

First Embodiment

Figure 1:
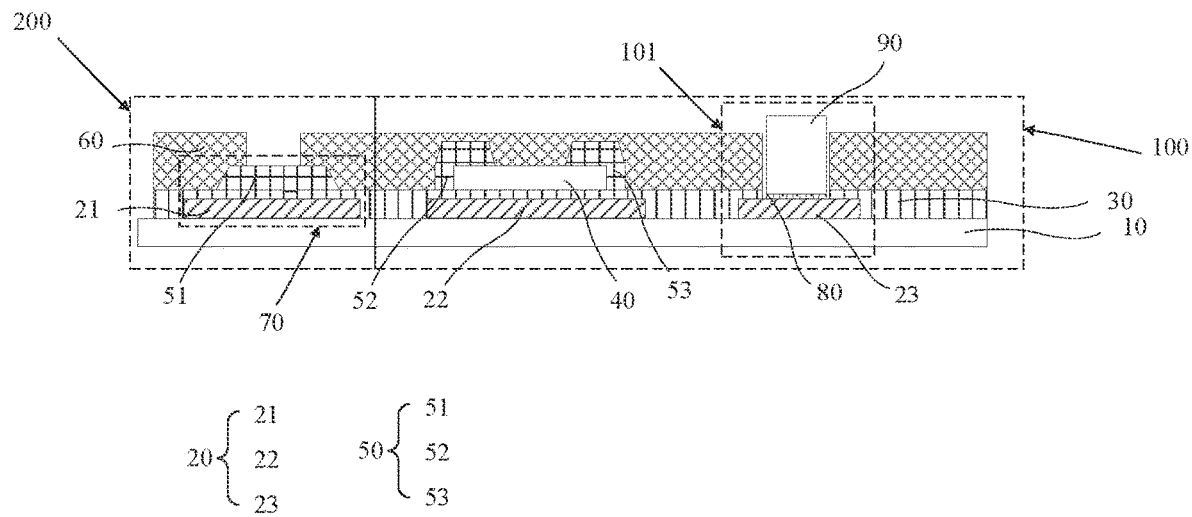
FIG. 1 is a structural schematic diagram of a display panel provided by an embodiment of the present application.

Please refer to FIG. 1, which is a structural schematic diagram of a display panel provided by an embodiment of the present application.

In the present application, the display panel includes a display region 100 and a non-display region 200 surrounding the display region. The display region 100 includes a plurality of pixel regions 101.

The display panel includes a substrate 10, a first electrode layer 20 disposed on the substrate 10, a first insulating layer 30 disposed on the first electrode layer 20, an active layer 40 disposed on the first insulating layer 30, a second electrode layer 50 disposed on the active layer 40, and a second insulating layer 60 disposed on the second electrode layer 50.

In this embodiment, the substrate 10 is a PI substrate, which is mainly polyimide. PI material can effectively increase light transmittance.

In this embodiment, the first electrode layer 20 includes a first electrode 21, a gate 22, and a solder pad 23, which are arranged at intervals.

The first electrode 21 corresponds to the non-display region 200. The gate 22 and the solder pad 23 correspond to the display region 100.

Furthermore, in this embodiment, the solder pad 23 corresponds to the pixel region 101.

Material of the solder pad 23 includes but is not limited to a molybdenum/copper stackup, a molybdenum-titanium alloy/copper stackup, or a titanium-molybdenum-nickel alloy/copper stackup.

In this embodiment, the first insulating layer 30 is a gate insulating layer.

Material of the first insulating layer 30 includes but is not limited to, silicon oxide, silicon nitride, silicon oxynitride, etc. or their stackups.

In this embodiment, the active layer 40 includes a channel region, a source contact region, and a drain contact region. The source contact region and the drain contact region are separated by the channel region.

Material of the active layer 40 includes but is not limited to semiconductor metal oxides such as indium-gallium-zinc oxide, indium-tin oxide, indium-zinc oxide, and aluminum-zinc oxide.

In this embodiment, the second electrode layer 50 includes a second electrode 51, a source 52, and a drain 53, which are arranged at intervals.

The second electrode 51 is positioned in the non-display region 200. The source 52 and the drain 53 are positioned in the display region 100.

In this embodiment, the second electrode 51 and the active layer 40 are in a same layer and are arranged at intervals.

In this embodiment, the display panel further includes a bonding lead 70 corresponding to the non-display region 200.

The bonding lead 70 includes the first electrode 21 and the second electrode 51.

The first insulating layer 30 is provided with a through hole at a position corresponding to the first electrode 21. The second electrode 51 is electrically connected to the first electrode 21 through the through hole.

In this embodiment, the source 52 and the drain 53 are disposed at two ends of the active layer 40. The source 52 is in contact with the source contact region. The drain 53 is in contact with the drain contact region.

In this embodiment, material of the second electrode layer 50 is a titanium-molybdenum-nickel alloy/copper/titanium-molybdenum-nickel alloy stackup.

In a manufacturing process of the display panel, some oxides require high-temperature processes, and the material of the second electrode layer 50 adopts the titanium-molybdenum-nickel alloy/copper/titanium-molybdenum-nickel alloy stackup to increase a temperature of the manufacturing process of the display panel. Meanwhile, compared with the prior art, the second electrode 51 can be configured as a COF bonding pad, thereby reducing a number of processes for manufacturing the electrode layers and saving manufacturing costs.

In this embodiment, the second insulating layer 60 is a passivation layer.

Material of the second insulating layer 60 includes but is not limited to silicon oxide, silicon nitride, silicon oxynitride, etc. or their stackups.

In this embodiment, the first insulating layer 30 and the second insulating layer 60 are provided with a first opening partially exposing the solder pad 23.

The second insulating layer 60 is provided with a second opening partially exposing the second electrode 51.

In this embodiment, under a vacuum environment, a soldering material is added into the first opening by a dispenser, and a solder electrode 80 of a mini/micro light-emitting diode 90 is bonded to the solder pad 23 through the soldering material by a transfer process.

The soldering material includes but is not limited to solder paste.

Figure 2:
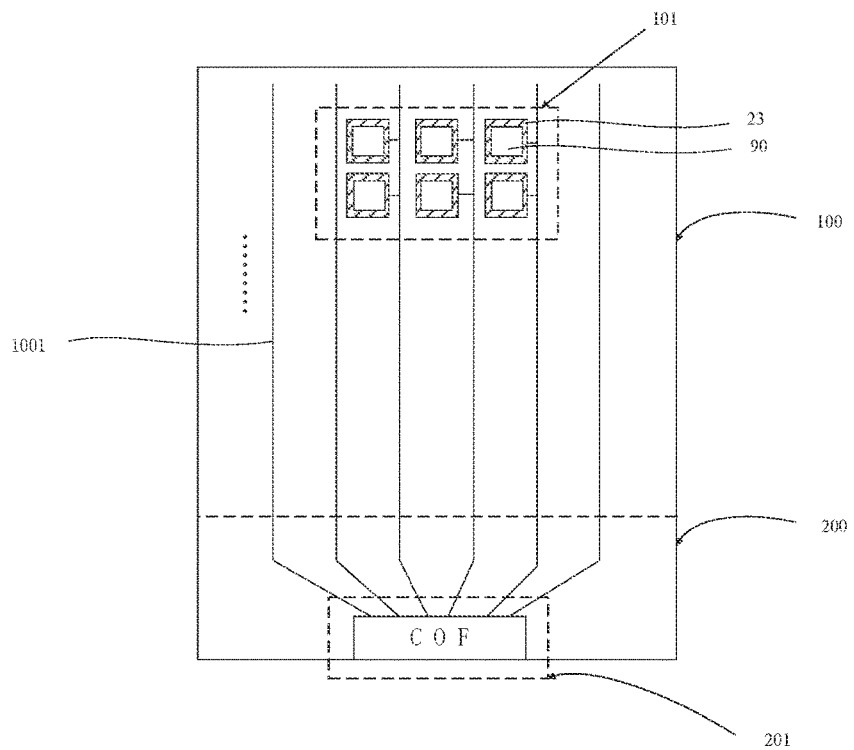
FIG. 2 is a top-view structural schematic diagram of the display panel provided by an embodiment of the present application.

Please refer to FIG. 2, which is a top-view structural schematic diagram of the display panel provided by an embodiment of the present application.

In this embodiment, the display panel includes a signal line 1001 disposed on the substrate 10 and corresponding to the display region 100.

The signal line 1001 extends from the display region 100 to the non-display region 200 and is electrically connected to the bonding lead 70.

In this embodiment, the signal line 1001 is electrically connected to the solder pad 23.

In this embodiment, the non-display region 200 includes a bonding region 201. The bonding lead 70 is disposed in the bonding region 201.

A circuit board is bonded to the display panel through the bonding lead 70 and transmits signals with the signal line 1001 through the bonding lead 70.

In this embodiment, it should be explained that the solder pad 23 and the signal line 1001 are arranged in a same layer, which is only used for explanation. A positional relationship between the solder pad 23 and the signal line 1001 is not limited in this embodiment.

This embodiment adopts at least one of the molybdenum/copper stackup, the molybdenum-titanium alloy/copper stackup, or the titanium-molybdenum-nickel alloy/copper stackup to form the solder pad 23 for bonding, which can effectively solve the problem of the poor bonding force between MTD and the soldering material in the prior art. Meanwhile, material of the second electrode layer 50 adopts the titanium-molybdenum-nickel alloy/copper/titanium-molybdenum-nickel alloy stackup to increase the temperature of the manufacturing process of the display panel, thereby ensuring a normal manufacturing process of oxides in the display panel.

Second Embodiment

Figure 3:
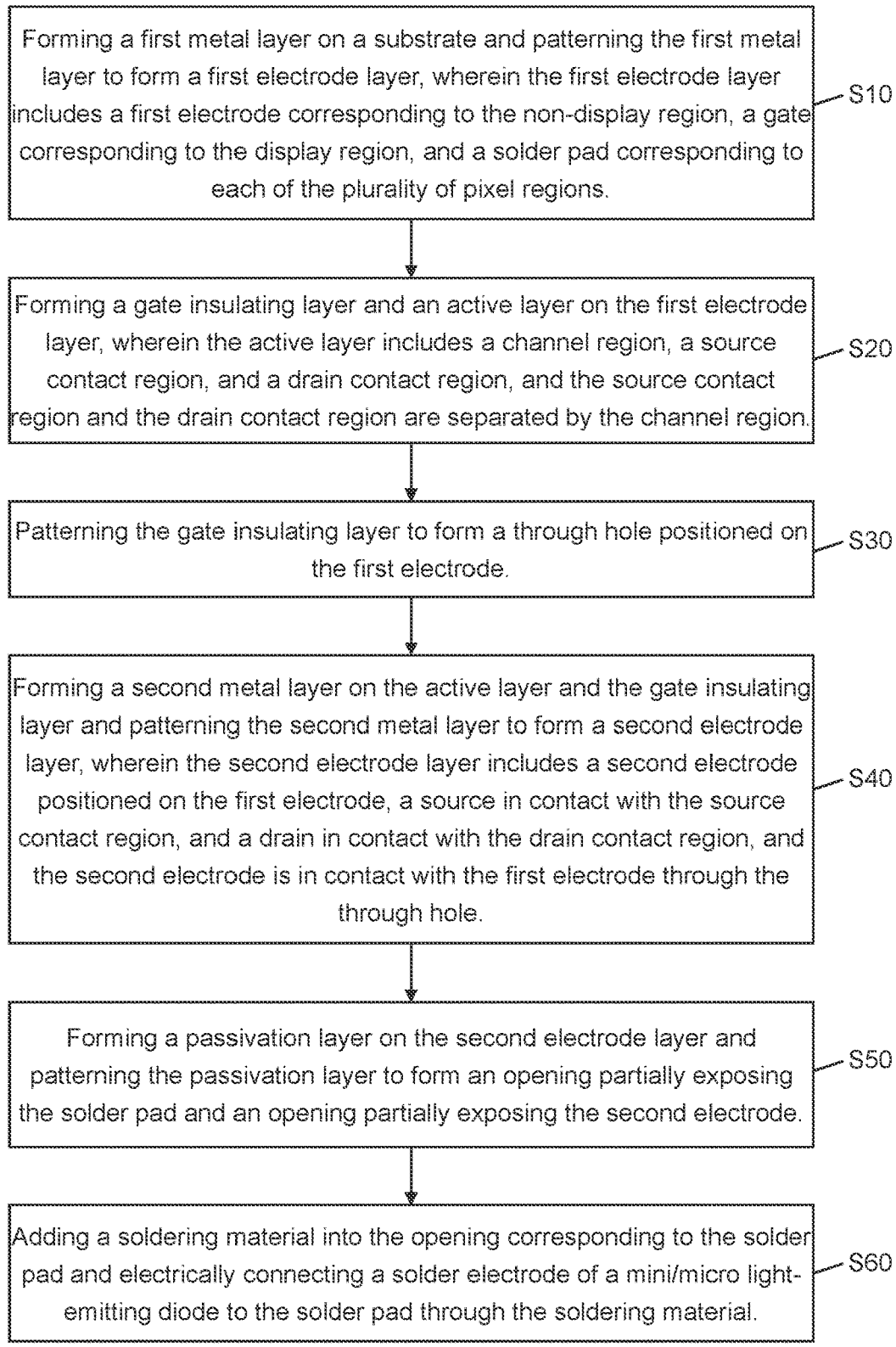
FIG. 3 is a flowchart of a manufacturing method of a display panel provided by an embodiment of the present application.

Please refer to FIG. 3, which is a flowchart of a manufacturing method of a display panel provided by an embodiment of the present application.

In this embodiment, the display panel includes a display region 100 and a non-display region 200 surrounding the display region 100. The display region 100 includes a plurality of pixel regions 101.

The manufacturing method includes the following steps.

Figure 4A:
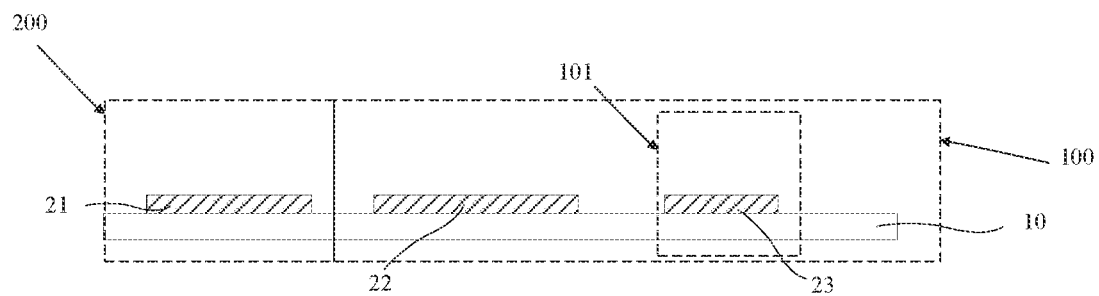
FIGS. 4A, 4B, 4C, 4D, 4E and 4F are structural schematic diagrams of manufacturing process provided by an embodiment of the present application.

Step S10: providing a substrate 10, forming a first metal layer on the substrate 10, and patterning the first metal layer to form a first electrode layer 20, wherein the first electrode layer 20 includes a first electrode 21 corresponding to the non-display region 200, a gate 22 corresponding to the display region 100, and a solder pad 23 corresponding to each of the plurality of pixel regions 101, as shown in FIG. 4A.

In this embodiment, the substrate 10 is a PI substrate, which is mainly polyimide. PI material can effectively increase light transmittance.

In this embodiment, material of the first metal layer includes but is not limited to a molybdenum/copper stackup, a molybdenum-titanium alloy/copper stackup, and a titanium-molybdenum-nickel alloy/copper stackup.

Figure 4B:
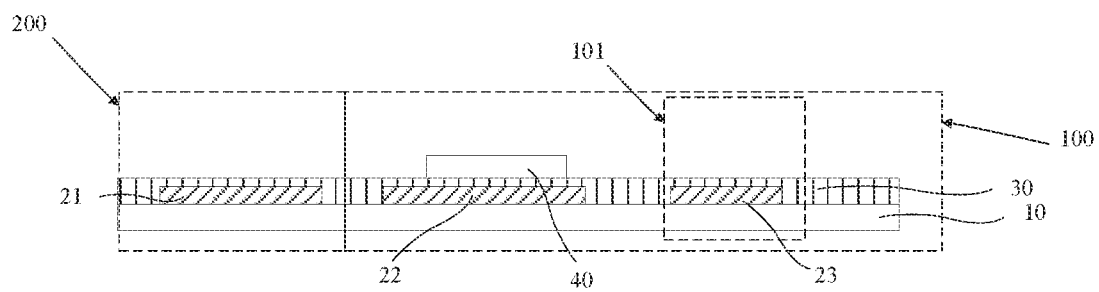

Step S20: forming a gate insulating layer 30 and an active layer 40 on the first electrode layer 20, wherein the active layer 40 includes a channel region, a source contact region, and a drain contact region, and the source contact region and the drain contact region are separated by the channel region, as shown in FIG. 4B.

Material of the gate insulating layer 30 includes but is not limited to silicon oxide, silicon nitride, silicon oxynitride, etc. or their stackups.

Material of the active layer 40 includes but is not limited to semiconductor metal oxides such as indium-gallium-zinc oxide, indium-tin oxide, indium-zinc oxide, and aluminum-zinc oxide.

Figure 4C:
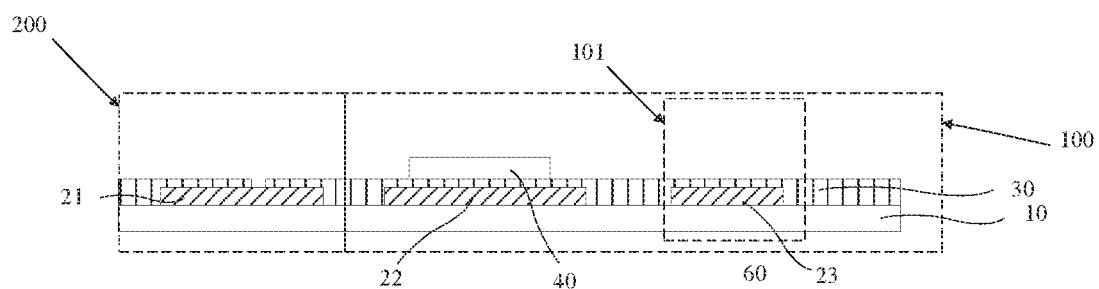

Step S30: patterning the gate insulating layer 30 to form a through hole positioned on the first electrode 21, as shown in FIG. 4C.

Figure 4D:
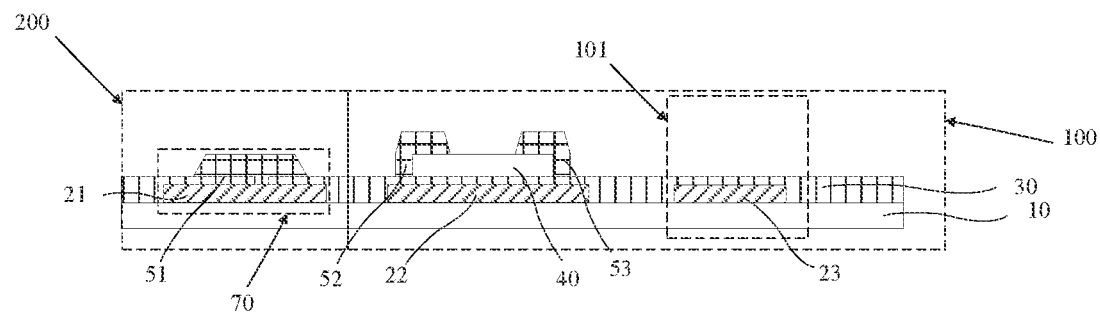

Step S40: forming a second metal layer on the active layer 40 and the gate insulating layer 30 and patterning the second metal layer to form a second electrode layer 50, wherein the second electrode layer 50 includes a second electrode 51 positioned on the first electrode 21, a source 52 in contact with the source contact region, and a drain 53 in contact with the drain contact region, and the second electrode 51 is in contact with the first electrode 21 through the through hole, as shown in FIG. 4D.

In this embodiment, material of the second electrode layer 50 is a titanium-molybdenum-nickel alloy/copper/titanium-molybdenum-nickel alloy stackup.

In a manufacturing process of the display panel, some oxides require high-temperature processes, and the material of the second electrode layer 50 adopts the titanium-molybdenum-nickel alloy/copper/titanium-molybdenum-nickel alloy stackup to increase a temperature of the manufacturing process of the display panel. Meanwhile, compared with the prior art, the second electrode 51 can be configured as a COF bonding pad, thereby reducing a number of processes for manufacturing the electrode layers and saving manufacturing costs.

In this embodiment, the display panel includes a bonding lead 70 corresponding to the non-display region 200.

The bonding lead 70 includes the first electrode 21 and the second electrode 51.

Figure 4E:
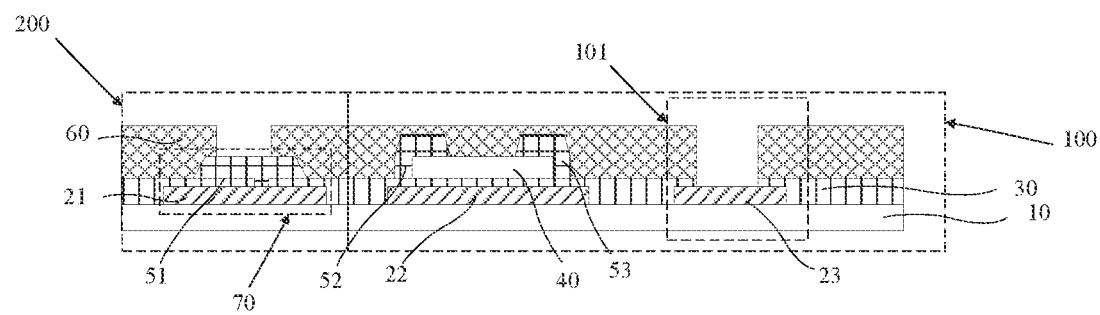

Step S50: forming a passivation layer 60 on the second electrode layer 50 and patterning the passivation layer 60 and the gate insulating layer 30 to form an opening partially exposing the solder pad 23 and an opening partially exposing the second electrode 22, as shown in FIG. 4E.

Material of the passivation layer 60 includes but is not limited to silicon oxide, silicon nitride, silicon oxynitride, etc. or their stackups.

Figure 4F:
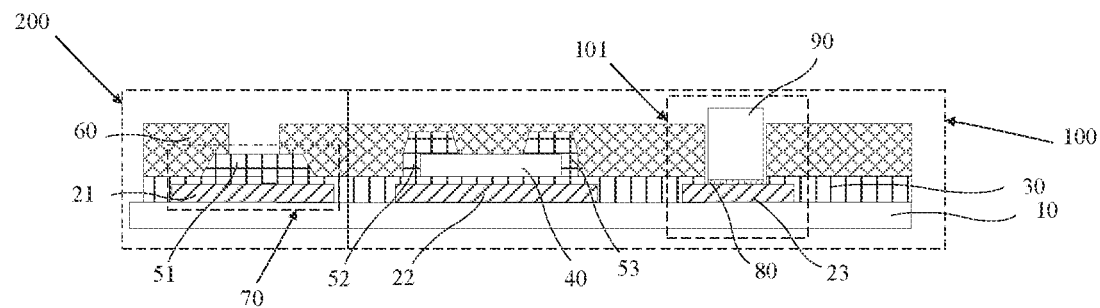

Step S60: adding a soldering material into the opening corresponding to the solder pad 23 and electrically connecting a solder electrode 80 of a mini/micro light-emitting diode to the solder pad 23 through the soldering material, as shown in FIG. 4F.

The soldering material includes but is not limited to solder paste.

In the step S60, the soldering material is added into the opening by a dispenser, and the solder electrode 80 of the mini/micro light-emitting diode 90 is electrically connected to the solder pad 23 through the soldering material by a transfer process.

This embodiment adopts at least one of the molybdenum/copper stackup, the molybdenum-titanium alloy/copper stackup, or the titanium-molybdenum-nickel alloy/copper stackup to form the solder pad 23 for bonding, which can effectively solve the problem of the poor bonding force between MTD and the soldering material in the prior art. Meanwhile, material of the second electrode layer 50 adopts the titanium-molybdenum-nickel alloy/copper/titanium-molybdenum-nickel alloy stackup to increase the temperature of the manufacturing process of the display panel, and the second electrode 51 can be configured as a COF bonding pad, thereby reducing a number of processes for manufacturing the electrode layers and saving manufacturing costs.

Third Embodiment

The present application further provides a display device. The display device includes the display panel in the first embodiment.

The display panel has been described in detail in the first embodiment, which is not repeated herein.

In summary, the present application provides the display panel, the manufacturing method thereof, and the display device. The display panel includes the display region and the non-display region surrounding the display region. The display region includes the plurality of pixel regions. The display panel includes the substrate, and the solder pad and the signal line disposed on the substrate. The solder pad corresponds to each of the plurality of pixel regions and is electrically connected to the signal line. Material of the solder pad includes at least one of the molybdenum/copper stackup, the molybdenum-titanium alloy/copper stackup, or the titanium-molybdenum-nickel alloy/copper stackup. The solder electrode of the mini/micro light-emitting diode is electrically connected to the solder pad through the soldering material.

The present application adopts the molybdenum/copper stackup to form the solder pad for bonding, which can effectively solve the problem of the poor bonding force between MTD and the soldering material in the prior art. Meanwhile, the bonding lead is made of titanium-molybdenum-nickel alloy/copper/titanium-molybdenum-nickel alloy stackup, which can reduce manufacturing processes of the display panel and reduce manufacturing costs.

Understandably, those having ordinary skills of the art may easily contemplate various changes and modifications of the technical solution and technical ideas of the present application and all these changes and modifications are considered within the protection scope of right for the present application.

What is claimed is:

1. A display panel, comprising:
   a display region comprising a plurality of pixel regions;
   a non-display region surrounding the display region;
   a substrate; and
   a solder pad and a signal line disposed on the substrate, wherein the solder pad corresponds to each of the plurality of pixel regions and is electrically connected to the signal line;
   wherein material of the solder pad comprises at least one of a molybdenum/copper stackup, a molybdenum-titanium alloy/copper stackup, or a titanium-molybdenum-nickel alloy/copper stackup; and
   wherein a solder electrode of a mini/micro light-emitting diode is electrically connected to the solder pad through a soldering material.

2. The display panel according to claim 1, further comprising a first electrode layer and a second electrode layer, which are disposed on the substrate;
   wherein the first electrode layer comprises a first electrode, a gate, and the solder pad, which are arranged at intervals;
   wherein the second electrode layer comprises a second electrode, a source, and a drain, which are arranged at intervals; and
   wherein the first electrode and the second electrode are positioned in the non-display region.

3. The display panel according to claim 2, further comprising a bonding lead corresponding to the non-display region;
   wherein the signal line extends from the display region to the non-display region and is electrically connected to the bonding lead;
   wherein the bonding lead comprises the first electrode and the second electrode; and
   wherein a circuit board is bonded to the display panel through the bonding lead and transmits signals with the signal line through the bonding lead.

4. The display panel according to claim 3, wherein material of the second electrode is a titanium-molybdenum-nickel alloy/copper/titanium-molybdenum-nickel alloy stackup.

5. The display panel according to claim 2, further comprising:
   an insulating layer disposed between the first electrode layer and the second electrode layer; and
   a passivation layer disposed on the second electrode layer;
   wherein the insulating layer and the passivation layer are provided with a first opening partially exposing the solder pad, the passivation is provided with a second opening partially exposing the second electrode, and the first opening contains the soldering material.

6. The display panel according to claim 5, further comprising an active layer disposed between the insulating layer and the second electrode layer;
   wherein the active layer comprises a channel region, a source contact region, and a drain contact region, and the source contact region and the drain contact region are separated by the channel region.

7. The display panel according to claim 6, wherein material of the active layer comprises at least one of indium-gallium-zinc oxide, indium-tin oxide, indium-zinc oxide, or aluminum-zinc oxide.

8. A manufacturing method of a display panel, wherein the display panel comprises a display region comprising a plurality of pixel regions and a non-display region surrounding the display region; and the manufacturing method comprises steps of:
   step S10: forming a first metal layer on a substrate and patterning the first metal layer to form a first electrode layer, wherein the first electrode layer comprises a first electrode corresponding to the non-display region, a gate corresponding to the display region, and a solder pad corresponding to each of the plurality of pixel regions;
   step S20: forming a gate insulating layer and an active layer on the first electrode layer, wherein the active layer comprises a channel region, a source contact region, and a drain contact region, and the source contact region and the drain contact region are separated by the channel region;
   step S30: patterning the gate insulating layer to form a through hole positioned on the first electrode;
   step S40: forming a second metal layer on the active layer and the gate insulating layer and patterning the second metal layer to form a second electrode layer, wherein the second electrode layer comprises a second electrode positioned on the first electrode, a source in contact with the source contact region, and a drain in contact with the drain contact region, and the second electrode is in contact with the first electrode through the through hole;
   step S50: forming a passivation layer on the second electrode layer and patterning the passivation layer to form an opening partially exposing the solder pad and an opening partially exposing the second electrode; and
   step S60: adding a soldering material into the opening corresponding to the solder pad and electrically connecting a solder electrode of a mini/micro light-emitting diode to the solder pad through the soldering material.

9. The manufacturing method according to claim 8, wherein the display panel further comprises a bonding lead corresponding to the non-display region;
   a signal line extends from the display region to the non-display region and is electrically connected to the bonding lead;
   the bonding lead comprises the first electrode and the second electrode; and
   a circuit board is bonded to the display panel through the bonding lead and transmits signals with the signal line through the bonding lead.

10. The manufacturing method according to claim 8, wherein material of the first metal layer comprises at least one of a molybdenum/copper stackup, a molybdenum-titanium alloy/copper stackup, or a titanium-molybdenum-nickel alloy/copper stackup.

11. The manufacturing method according to claim 8, wherein material of the second metal layer is a titanium-molybdenum-nickel alloy/copper/titanium-molybdenum-nickel alloy stackup.

12. The manufacturing method according to claim 8, wherein material of the active layer comprises at least one of indium-gallium-zinc oxide, indium-tin oxide, indium-zinc oxide, or aluminum-zinc oxide.

13. The manufacturing method according to claim 8, wherein in the step S60, the soldering material is added into the opening by a dispenser, and the solder electrode of the mini/micro light-emitting diode is electrically connected to the solder pad through the soldering material by a transfer process.

14. A display device, comprising a display panel;
wherein the display panel comprises:
a display region comprising a plurality of pixel regions;
a non-display region surrounding the display region;
a substrate; and
a solder pad and a signal line disposed on the substrate, wherein the solder pad corresponds to each of the plurality of pixel regions and is electrically connected to the signal line;
wherein material of the solder pad comprises at least one of a molybdenum/copper stackup, a molybdenum-titanium alloy/copper stackup, or a titanium-molybdenum-nickel alloy/copper stackup; and
wherein a solder electrode of a mini/micro light-emitting diode is electrically connected to the solder pad through a soldering material.

15. The display device according to claim 14, wherein the display panel further comprises a first electrode layer and a second electrode layer, which are disposed on the substrate;
the first electrode layer comprises a first electrode, a gate, and the solder pad, which are arranged at intervals;
the second electrode layer comprises a second electrode, a source, and a drain, which are arranged at intervals; and
the first electrode and the second electrode are positioned in the non-display region.

16. The display device according to claim 15, wherein the display panel further comprises a bonding lead corresponding to the non-display region;
the signal line extends from the display region to the non-display region and is electrically connected to the bonding lead;
the bonding lead comprises the first electrode and the second electrode; and
a circuit board is bonded to the display panel through the bonding lead and transmits signals with the signal line through the bonding lead.

17. The display device according to claim 16, wherein material of the second electrode is a titanium-molybdenum-nickel alloy/copper/titanium-molybdenum-nickel alloy stackup.

18. The display device according to claim 15, wherein the display panel further comprises:
an insulating layer disposed between the first electrode layer and the second electrode layer; and
a passivation layer disposed on the second electrode layer;
wherein the insulating layer and the passivation layer are provided with a first opening partially exposing the solder pad, the passivation is provided with a second opening partially exposing the second electrode, and the first opening contains the soldering material.

19. The display device according to claim 18, wherein the display panel further comprises an active layer disposed between the insulating layer and the second electrode layer; and
the active layer comprises a channel region, a source contact region, and a drain contact region, and the source contact region and the drain contact region are separated by the channel region.

20. The display device according to claim 19, wherein material of the active layer comprises at least one of indium-gallium-zinc oxide, indium-tin oxide, indium-zinc oxide, or aluminum-zinc oxide.

* * * * *